(12) United States Patent
Girard, III et al.

(10) Patent No.: US 8,570,147 B2
(45) Date of Patent: Oct. 29, 2013

(54) DEBOUNCE STRATEGY FOR VALIDATING SWITCH ACTUATION

(75) Inventors: Hilton W. Girard, III, West Bloomfield, MI (US); Keith A. Christenson, Canton, MI (US)

(73) Assignee: Lear Corporation, Southfield, MI (US)

( * ) Notice: Subject to any disclaimer, the term of this patent is extended or adjusted under 35 U.S.C. 154(b) by 810 days.

(21) Appl. No.: 12/787,650

(22) Filed: May 26, 2010

(65) Prior Publication Data

US 2011/0291799 A1    Dec. 1, 2011

(51) Int. Cl.
*G05B 19/00* (2006.01)
*G06F 7/00* (2006.01)
*H04B 1/00* (2006.01)

(52) U.S. Cl.
USPC ..... 340/5.72; 340/540; 340/5.62; 340/426.24

(58) Field of Classification Search
CPC .............................. G08B 21/001; H03M 11/00
USPC ............. 340/5.72, 5.62, 426.24, 426.36, 540, 340/539.1, 686.1; 726/16, 26; 341/24, 26; 345/168, 169; 49/394, 280, 360
See application file for complete search history.

(56) References Cited

U.S. PATENT DOCUMENTS

| | | | |
|---|---|---|---|
| 4,115,858 A | 9/1978 | Kaufman | |
| 4,581,603 A | 4/1986 | Ingold et al. | |
| 5,640,807 A * | 6/1997 | Shigematsu et al. | 49/449 |
| 6,795,011 B1 * | 9/2004 | Berthoud et al. | 341/173 |
| 7,015,791 B2 * | 3/2006 | Huntzicker | 340/5.54 |
| 7,173,346 B2 * | 2/2007 | Aiyama et al. | 307/9.1 |
| 7,181,767 B1 * | 2/2007 | Sethia et al. | 726/16 |
| 7,218,250 B2 * | 5/2007 | Laliberte et al. | 341/24 |
| 7,511,602 B2 * | 3/2009 | Huntzicker | 340/5.54 |
| 7,786,901 B2 * | 8/2010 | Alberth et al. | 341/24 |
| 7,889,074 B2 * | 2/2011 | Anderson | 340/540 |
| 2003/0067398 A1 | 4/2003 | Leichtfried et al. | |
| 2007/0018790 A1 | 1/2007 | LaFrance | |
| 2007/0085659 A1 | 4/2007 | Anderson | |
| 2007/0132554 A1 | 6/2007 | Anderson | |
| 2008/0246634 A1 | 10/2008 | Alberth et al. | |
| 2009/0262790 A1 | 10/2009 | Molotchko et al. | |

FOREIGN PATENT DOCUMENTS

| | | |
|---|---|---|
| DE | 19723188 B4 | 12/1998 |
| EP | 0570761 A1 | 5/1993 |

OTHER PUBLICATIONS

Great Britain Search and Examination Report for corresponding Application No. GB1108849.9, mailed Sep. 13, 2011, 8 pages.

* cited by examiner

*Primary Examiner* — Nam V Nguyen
(74) *Attorney, Agent, or Firm* — Brooks Kushman P.C.

(57) ABSTRACT

A debounce strategy is disclosed for use with a switch detection circuit to validate whether the switch is properly actuated or whether interferences, switch bounce, or other interruptions are presenting indications of switch activation. The debounce strategy may be implemented in a multi-stage process so that systems relying on debounce validation can begin processing, or other so that other time depending operations begin processing, prior to completing debounce validation.

17 Claims, 3 Drawing Sheets

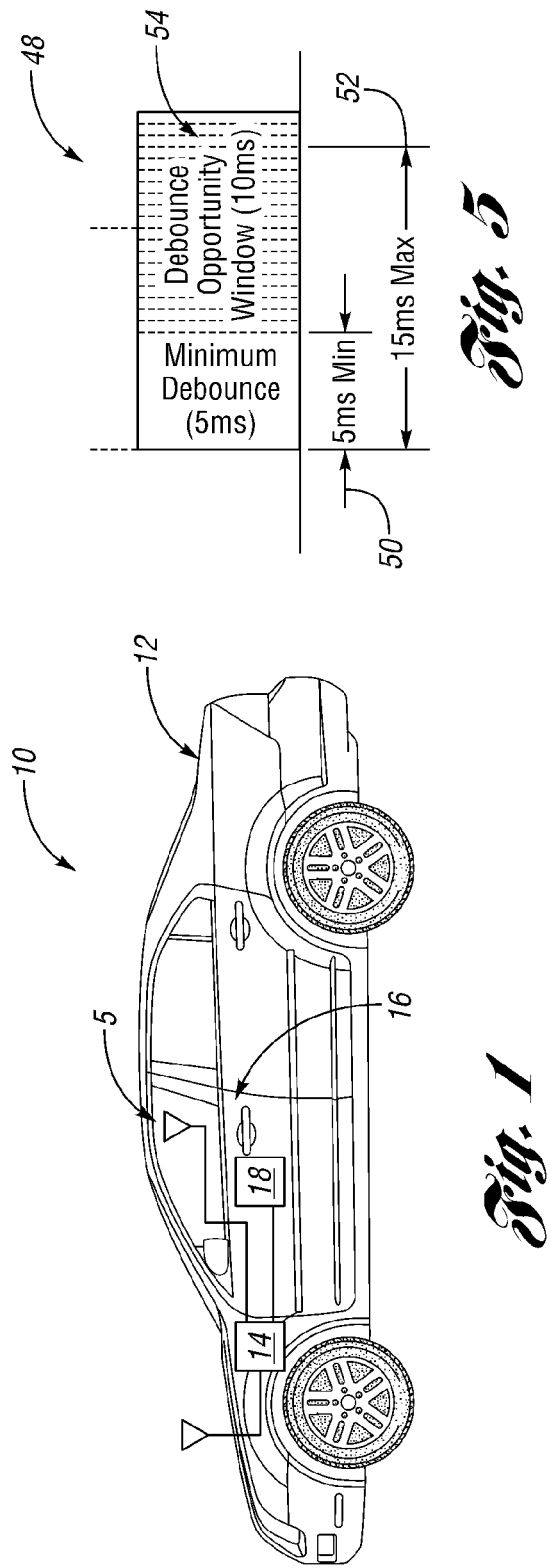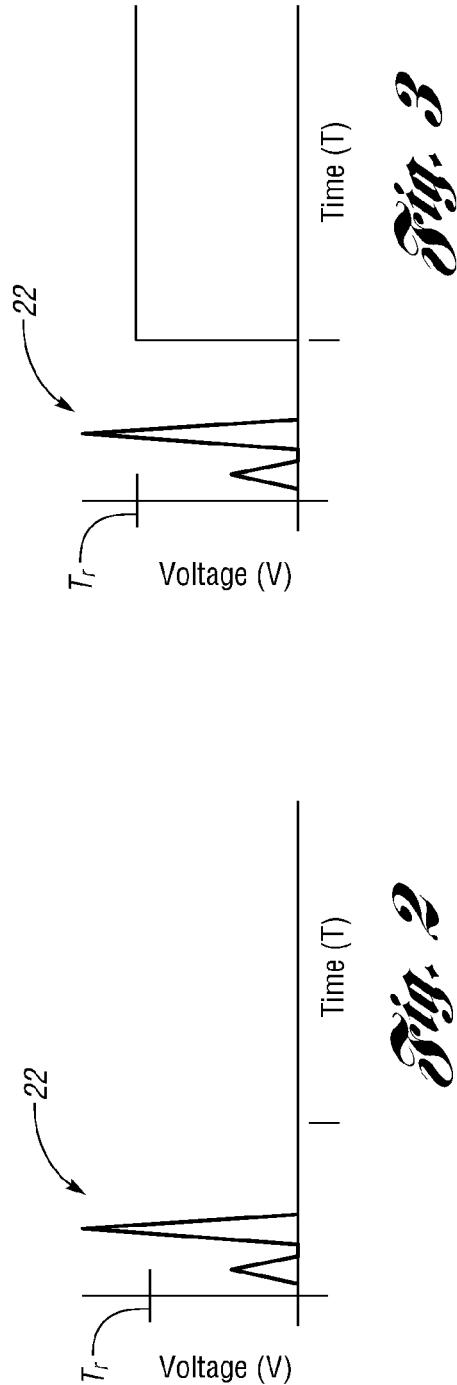

US 8,570,147 B2

DEBOUNCE STRATEGY FOR VALIDATING SWITCH ACTUATION

TECHNICAL FIELD

The present invention relates to debounce strategies and the implementation thereof, such as but not limited to debounce strategy of the type used to validate actuation of a switch.

BACKGROUND

An automotive environment is traditionally considered to be a very harsh and extreme environment with respect to electrical noise, radio frequency (RF) interference, electromagnetic interference (EMI), vibration, temperature, humidity, etc. A vehicle is never considered a stationary device, thus it is always moving and subject to an environment with continually varying conditions. It is also well known and accepted in the automotive engineering society that extreme environmental conditions do exist. Considering these facts, it makes it virtually impossible to predict the nature of the environment or conditions a vehicle will be exposed to at any given moment. Therefore, to create a robust electronic control system, a system that performs favorably while subject to the worst case environments and conditions is desirable.

The inputs to an automotive system can contain mechanical switches. It is well known that mechanical switches have aging and mechanical contact bounce characteristics that can vary over time and under different environmental conditions. These mechanical switches are typically connected to the electronic controlling device through long wires. These long wires can contribute to noise on the input in several different ways. Of these ways, it is possible for the wires to act as antennas, thus coupling strong RF radiation into the controlling device. In addition, switch wires that are parallel with other wires can cross-couple inductive energy further adding to the possibilities of noise and interference. With these common factors and others taken into consideration it becomes increasingly important to have a proper and applicable input processing strategy.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

FIG. 1 illustrates a passive entry system for use with a vehicle in accordance with one non-limiting aspect of the present invention;

FIGS. 2-3 graphically illustrate a voltage level reported by a door handle detection circuit;

FIG. 5 illustrates a time graph.

DETAILED DESCRIPTION

Figure 4:
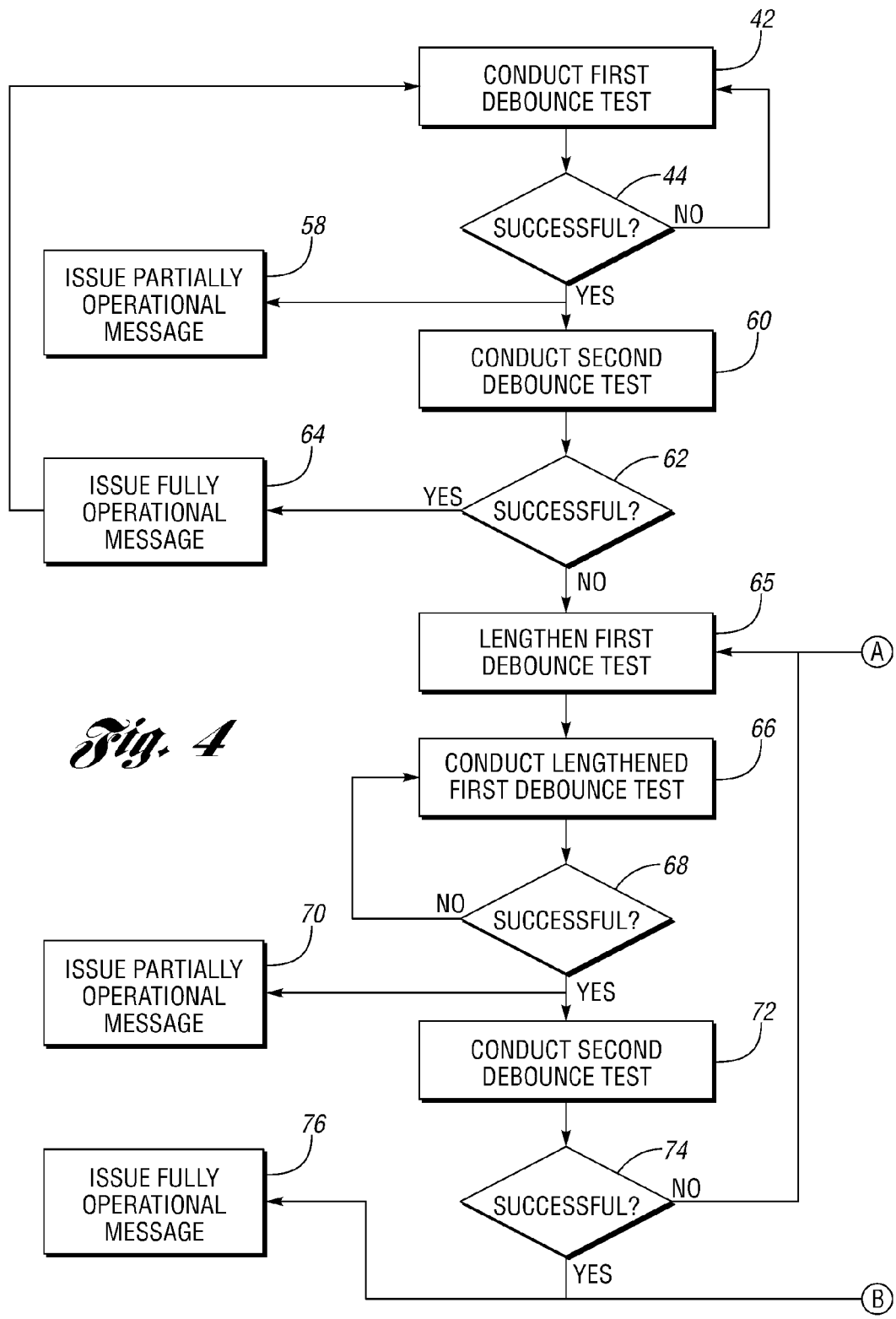
FIG. 4 illustrates a flowchart of a multi-stage debounce strategy contemplated by one non-limiting aspect of the present invention.
Figure 4:
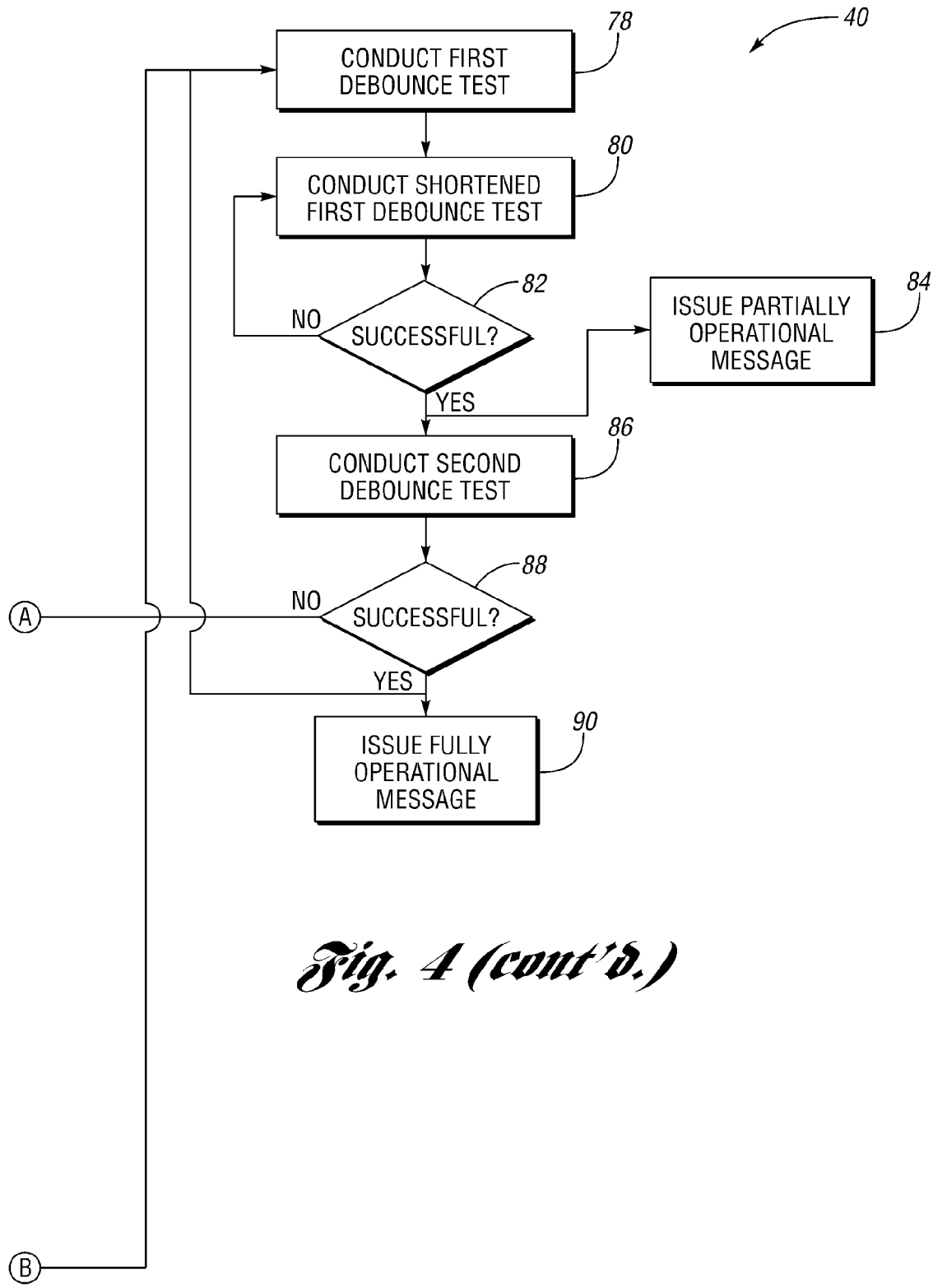

FIG. 1 illustrates a passive entry system 10 for use with a vehicle 12 in accordance with one non-limiting aspect of the present invention. The passive entry system 10 is shown to include a passive entry controller 14 operable for implementing passive entry related control of one or move vehicle systems. The passive entry related controls may be instigated upon user actuation of a door handle (switch) 16, or other operation, and result in control of any number of vehicle systems, as one skilled in the art will appreciate. While the present invention is described with respect to supporting passive entry, the present invention fully contemplates facilitating other types of controls, and not just vehicle-based controls instigated upon actuation of a door handle switch.

The system 10 may include a debounce controller 18 operable to validate actuation of the door handle. (While shown to be separate, the debounce controller 18 may be part of the passive entry controller 14 and/or the functionality may be otherwise included as apart of the passive entry controller 14.) A door handle detection circuit (not shown) may be used to electrically report actuation of the door handle 16 to the debounce controller. FIGS. 2-3 graphically illustrate a voltage level (V) reported by the door handle detection circuit. The voltage detected by the circuit may change when the door handle 16 is being actuated from a first, closed position (FIG. 2) to a second, open position (FIG. 3). The voltage V is shown to increase with handle actuation for exemplary purposes—the voltage V may decrease. The door handle 16, like many pull-switches activated through mechanical actuation, may be subject to electrical noise, radio frequency (RF) interference, electromagnetic interference (EMI), vibration, temperature, humidity, and other disturbance that may also cause voltage levels to be registered by the detection circuit. These, so called 'false' voltages, are generally referred to with reference numeral 22.

In the event the false voltages are greater than a threshold (Tr) used to indicate actuation of the door handle 16, a false or incorrect action could be taken in response by the passive entry controller 14 or other element/device it the vehicle 12 that relies on the circuit to detect actuation of the door handle 16. One non-limiting aspect of the present invention contemplates the debounce controller 18 being operable to implement a debounce strategy in order to ameliorate the likelihood of false voltages resulting in false or incorrect action by the passive entry controller 14 or other elements/devices within the vehicle 12. The debounce strategy contemplated at least by one non-limiting aspect of the present invention may be a multiple stage strategy that provides a preliminary indication of switch actuation validity to be followed by a concluding indication of switch actuation validity. This multi-stage approach may be helpful in allowing the passive entry controller 14 or other depending vehicle systems to begin at least some processing/operation prior to concluding the validity of switch actuation.

FIG. 4 illustrates a flowchart 40 of a multi-stage debounce strategy contemplated by one non-limiting aspect of the present invention. The method may be implemented with the debounce controller 18 described above or with some other device capable of performing logical operations sufficient to execute the operations contemplated to conduct the debounce strategy of the present invention. One non-limiting aspect of the multi-stage approach contemplated by the present invention includes conducting a first debounce test and a subsequent second debounce test upon successful completion of the first debounce test. The debounce tests generally relate to assessing the presence of a voltage level for a period of time sufficient to indicate actuation of the door handle. The time period of one or both of the debounce tests may be adjusted (lengthened and/or shortened) depending on whether the preceding test was successful or unsuccessful. Success may be determined according to whether the voltage level was equal to or greater than the period of time set for that particular debounce test (as noted, the periods of time may be adjusted and changed from one test to the next).

Block 42 begins with conducting a first debounce test. The first debounce test includes testing whether the voltage level of the detection circuit has changed by an amount typically associated with actuation of the door handle 16, i.e., from a first voltage level to a second voltage level. The test may be performed by the debounce controller or the voltage detector monitoring the voltage levels registered by the door handle detection circuit. The debounce controller 18 may include a counter, a timing circuit, a memory, a processor and/or other features in order to facilitate these and other operations contemplated by the present invention.

Block 44 relates to determining whether the first debounce test was successful. The first debounce test is determined to be successful if the voltage level is at or equal to the second voltage (or other voltage level associated with the door handle 16 being moved from the first to the second position) for a first period of time. The first period of time may be selected to be longer than a period of time during which the false voltages typically last or the period of time during which the door handle 16 switch will bounce when actuated due to the particular mechanical configuration and operation of the door handle 16. This may be done to help insure only voltage levels associated with the actual actuation of the door handle 16 are considered.

FIG. 5 illustrates a time graph 48 where the first period of time is referred to with reference numeral 50. At least initially, the first period off time corresponds with a portion of a maximum period 52 of time set to complete the first debounce test. The first period of time is shown to be initially 5 ms and the maximum period of time is shown initially to be 15 ms. Rather than requiring the voltage level to be greater than the threshold for the entire 15 ms, the present invention contemplates speeding the test process by requiring the voltage level to be greater than the threshold for on the first period of time. The first and maximum period of time may be selected according to design parameters and capabilities of the debounce control and the handle diction circuit to monitor and process the voltage levels.

As explained in more detail below, the difference in time between the first period of time and the maximum period of time may define an opportunity window 54. The opportunity window represents additional time that may be added to the first period of time in order to increase the duration during which the first debounce test can be successfully completed. The switch input (voltage level) may be sampled at an established sample rate and each active state (second voltage) of the switch input may be counted using a continuous counter. The switch input is considered preliminarily debounced when the continuous counter reaches a predetermined limit. As described below, this predetermined limit is adaptive and may change based on previous false activations.

The initial continuous count limit may be established as a percentage value (P) that is 90% of 5 ms (T1, equal first period of time) or equal to 4.5 ms of debounce time. Because of the given initial switch bounce, a 10% allowance is specified so the end result is approximately 5 ms. For example, if the sample rate is 100 uS (R), then the continuous count limit will be 45 counts before the switch input can be considered active. The continuous counter shall reset back to zero each time an inactive state is detected (voltage less than the second voltage), therefore, it shall take a continuous activation of the switch input for the continuous counter to count up to the limit.

If the switch input tends to be noisier than normal, it will take slightly longer for the switch input to become continuously active, e.g., the switch tends to bounce when moved. In that case, the first debounce time can be successfully completed as long as the voltage level is continuously greater than the threshold for the specified number of counts before expiration of the maximum period of time. In this manner, the first debounce test may include monitoring the voltage level beyond the first period of time. Having the debounce opportunity window insures that there is no sacrifice to detection robustness, but this comes at the expense of a slight increase in latency for noisy switches. When the predetermined continuous count has been reached anytime within the debounce opportunity window, the input shall be considered active and the first debounce test shall be successfully completed.

In the event the 15 ms preliminary debounce opportunity period has expired and the switch input was not successfully debounced, no further action is taken. The decision is made to immediately return back to idle or sleep mode, i.e., for the passive entry controller 14 or other vehicle dependent system to await register of further voltages by the detection circuit equal to or in excess of the threshold before transitioning from a sleep state. In the event the first debounce test is successful, a first message, referred as a partially operational message, is issued by the debounce controller 18 at Block 58. At this issuance, a preliminary debounce determination is made and the passive entry system can then begin doing preliminary passive communications.

The partially operational message may be communicated by the debounce controller 18 to the passive entry controller 14 and any other device in the vehicle over a vehicle communication network or bus (not shown). The partially operation message may include instructions or otherwise be understood by the recipient such that the recipient is prompted to transition from a sleep mode to a partially operation mode. The sleep mode generally corresponds with the recipient being inactive and minimally powered, if at all. The partially operation state is defined as a state where the recipient is awaken from sleep mode but has not or is not permitted to transition to a fully operational mode, i.e., it is not permitted to execute all the operations it may be able to execute in fully operation mode and/or is may not be permitted to consume as much power as it would in fully operation mode.

In the case of the recipient being an integrated circuit or other device having output pins/ports, the difference between the partially operational and fully operation states may be understood in terms of the pins being energized or driven high/low in order to communicate output and/or to control other devices. In the fully operation state, each of a plurality of pins may be powered, biased, or otherwise capable of outputting a signal. The partially operation state may be differentiated from the fully operation state at least in so far as at least some number of the plurality of pins being operational in the fully operation state are inoperable or de-energized in the partially operational state.

Following a successful first debounce test, a second debounce test is conducted at Block 60. The second debounce test may be performed by the debounce controller 18 in a manner similar to the first debounce test where the debounce controller 18 is required to monitor the voltage level of the door handle detection circuit to determine whether the voltage level is greater than the threshold for a second period of time. The second period of time is chosen to be longer than the first period of time (e.g., 30 ms) in order to provide a concluding validation. This validating debounce may be a fixed opportunity period that begins immediately after the preliminary debounce determination, as the validation debounce period may need to be synchronized to the end of the passive communications (e.g. so that the passive entry controller 14 can be transitioned to the fully operation state, if appropriate, just as the power-up is completed as part of the partially operational state).

During the validation debounce period, the switch input may be sampled using the same sample rate used during the preliminary debounce period (first debounce test) and each active state of the switch input may be counted using a continuous counter. Block 62 determines the second debounce test to be successful and the switch input is considered fully debounced and validated when the continuous counter exceeds a value that is equal to a time that is 90% of 30 ms or equal to 27 ms of debounce time. Unlike the first debounce time where a successful result can be concluded before expiration of the maximum period of time, i.e., during the first period time, the second debounce test is configured such that the voltage must register above the threshold for at least 90% of the second period of time. This may be helpful to insure a sufficient, continuous voltage before validating the door handle actuation.

In the event the second debounce test is successful, a second, fully operation message may be issued in Block 64 by the debounce controller to the passive entry controller or other recipient in order to facilitate transition the recipient from the partially operational state to the fully operational state. Once in the fully operational state, the transitioned recipient will now be able to execute operations that result in control of one or more vehicle systems, e.g., in the case of passive entry, door unlock, trunk opening, engine start, etc. These types of operations were not permitted during the partially operational state so that the validity of the door handle actuation (or false voltage level) could be more fully assessed during the longer second period of time. The ability to transition to the partially operation state prior to transitioning to the fully operational state allows the present invention to speed the total time taken to transition to the fully operation state since the time taken to power-up and prepare the passive entry controller is completed prior to completion of the second debounce test and/or without having to await completion of the second debounce test In the event the 30 ms validation debounce period has expired and the switch input was not successfully validated, passive communications are aborted and no further action is taken. The decision may be made to immediately return all systems back to idle or sleep mode. Rather than beginning the test in Block 42, one non-limiting aspect of the present invention contemplates lengthening the first period of time following an unsuccessful second debounce test and begins testing in Block 65. When the second debounce time is unsuccessful, it may be helpful to assume the failure was caused by false voltage that persisted longer than the first period of time, even though this may not be the case, such as if the user lifted the door handle 16 and relatively quickly released it.

As noted above, the first debounce test conducted in Block 42 was considered successful as long as the voltage level was equal to or greater than the threshold for the first period of time. This time period could be satisfied within the first 5 ms and/or at any point thereafter up to 15 ms, i.e, the voltage was only required for a continuous period of time measured by the first period of time and occurring prior to expiration of the maximum period of time. Since the second debounce test ultimately resulted in a false or unsuccessful validation, the first period of time may lengthened in order to require the voltage to be at least equal to the threshold for a longer period to time in order to add robustness and make it more difficult to pass the first debounce test.

Block 66 relates to conducting the first debounce test with the lengthened first period of time for one or more subsequent implementations of the multi-stage debounce strategy. This may, for example, including lengthening the first period of time by one unit. The one unit may be defined as R, where R is the sampling rate, e.g., 1 ms. Of course, the one unit may be defined as a multiple of the sampling rate R (e.g. 2×, 2.x, 10×, etc. xR) or according to some other fixed or variable value. Block 68 determines whether lengthened first debounce test was successful according to whether the voltage was at least equal to the threshold for the lengthened first period of time. If the test was unsuccessful, Block 66 is returned to and the passive entry controller remains in sleep mode. If the test was successful, the partially operation message is issued in Block 70 and the second debounce test is conducted again in Block 72.

The second debounce conducted again in Block 72 may be exactly the same test as that conducted in Block 60. Optionally, the second period of time considered in the second debounce test may be shortened an amount equal to the lengthening of the first debounce period of time. This may be done to reduce the time taken to complete the concluding stage (second debounce test) of the multi-stage strategy in light of the lengthened preliminary stage (first debounce test). In the event the timing or other parameters associated with issuance of the partially and fully operational message do not permit this reduction in time and/or if it would otherwise be desirable not to decrease the second period of time, the second period of time may be fixed throughout.

In the event the second debounce test conducted in Block 72 is determined in Block 74 to be unsuccessful, the multiple-stage testing is resumed with the first period of time being lengthened by another unit in Block 65. This process may be repeated until the first period time equals the maximum period of time if the first debounce test continues to be successful and followed by an unsuccessful second debounce test. In the event the second debounce test conducted in Block 74 is successful, the fully operation message is issued in Block 76 and the lengthened first period time is shortened in Block 78 prior to re-starting the multi-stage debounce testing again in Block 80.

The shortening of the first period of time in Block 78 may be done to insure the false voltage present for a certain period of time do not maintain an unnecessarily long first period of time thereafter, i.e., one non-limiting aspect of the present invention contemplates reverting back to the original first period of time set in Block 42 after a sufficient number of successful second debounce test. The shortening may be made in the same proportion to the lengthening in Block 65 or in a different proportion. In some cases, it may be beneficial to shorten the first period of time in Block 78 twice as much as it was lengthened in Block 65. This can be helpful in more quickly attempting to return to the original first period of time set in Block 42.

The first debounce test is then conducted in Block 80 at the shortened first period of time for the next testing event, i.e., the next time the door handle is lifted. In the event the test is unsuccessful, Block 80 is returned to the process repeats at as the same, shortened first period to time. The first period of time used in Block 80, therefore, remains the same until at least on successful test is conducted. If the test of Block 80 is deemed successful in Block 82, the partially operational message is issued in Block 84 and the second debounce test is conducted in Block 86. In the event the second debounce test is deemed in Block 88 as unsuccessful, Block 65 is returned in order to re-lengthen the first period of time for subsequent test. In the event the test is successful, the fully operational message is issued in Block 90 and the first time period is shortened again in Block 80. Optionally, the shortening of Block 80 may be limited such that period of time is never less than the original period of time used in Block 42.

As supported above, one non-limiting aspect of the present invention relates to a passive entry system having capabilities to begin passive communications early, based on a short preliminary debounce result. While communication is in process, the activation switch (e.g., door handle) may still continue to be debounced using a secondary validation debounce. When the validation debounce duration completes and the switch input passes the criteria, then the input may be considered valid and passive communication continues as normal. If the switch input deactivates at any point during the validation debounce duration, then the input activation may be considered invalid and passive communication is immediately aborted.

There may be some risks involved with this type of approach. The preliminary debounce may be short to reduce overall latency, but long enough to avert false activations. It is apparent that a shorter preliminary debounce will be favored to reduce latency; but in contrast, the increased risk for false activations must also be understood. Since the passive communication begins after a successful preliminary debounce, the system may now be drawing more operating current. If environmental disturbances persist for any length of time, there is a potential for higher quiescent current and battery drain as a result of false activations. This is an unacceptable behavior for automotive systems that operate on standby power. To counteract this undesirable behavior, the preliminary debounce duration may be flexible to the environmental conditions by using an adaptive debounce strategy.

Taking into consideration the unpredictable and extreme conditions a vehicle can be exposed to in the automotive environment; the worst case in designing a system is to be considered. For switch inputs, it is desirable to be able to explicitly discriminate between a positive user-activated switch input and a false activation due to some unpredictable environmental circumstance. To accomplish this, one non-limiting aspect of the present invention specifies as a continuous and uninterrupted activation of an input for the longest duration possible without the user experiencing any noticeable delay. This may make a robust acceptance criteria possible but is typically unachievable due to implementation constraints. These constraints involve size, cost, sample rate, processing speed, etc.

In the automotive environment, such as where a mechanical switch input is electrically interfaced into a digital input of a microcontroller, the electrical interface may contain some component that filters out high frequency content. The present invention, for exemplar purposes, assumes the expected input will have a frequency no higher than 100 kHz. Since the microcontroller is a sequential processing device, it is not always possible for the processor to continuously look at the switch input to monitor change, thus resulting in potential aliasing of the input. There are complicated ways to nearly eliminate aliasing using interrupt processing, but that is beyond the scope of this document. To alleviate the aliasing effect, it is desirable to have the fastest sample rate possible, but this is not always possible either.

The average time that an automotive processor can sample an input while doing other processing is typically around 1 ms or 1 kHz. Taking into consideration these sampling constraints, we must accept the limitations and affects of aliasing. To mitigate the affects of aliasing, the only logical option is to choose to sample the input for a long duration. The longer the input is sampled, the more there is the chance that we will see a point in time where the input is inactive, thus not meeting our acceptance criteria for continuous and uninterrupted activation. It is clear that greater accuracy can be gained from longer sample durations, but it is obvious that it may be desirable not to sample too long or else the user is likely to experience noticeable system delays. The typical reaction time before a user can notice a delay has been well known and is accepted to be less than 70 ms or so. In an automotive passive entry application, activation latency is of the utmost importance. Therefore, it is disadvantageous to debounce the activation switch input for as long as possible. On the contrary, in order to reduce latency, it is most desirable to debounce as short as possible. The present invention is able to solve this dilemma by supporting parallel operations.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention. The features of various implementing embodiments may be combined to form further embodiments of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. For use with a door handle pull-switch operable between a first position and a second position with a pulling motion, the first position corresponding with a door lock being orientated to lock a vehicle door, the second position corresponding with the door lock being orientated to unlock the vehicle door, a method comprising:

monitoring a voltage level of a door handle detection circuit that is configured to generate electrical signals reflective of the door handle being actuated from the first position to the second position, the voltage level changing from a first level to a second level upon actuation of the door handle from the first position to the second position;

after detecting the voltage level to be at least equal to the second level, performing a first debounce test to determine whether the second voltage is continuously detected for at least a first period of time;

in the event the second level is continuously detected for at least the first period of time:
  (i) issuing a first message to indicate a successful completion of the first debounce test; and
  (ii) conducting a second debounce test to determine whether the second voltage is continuously detected for a second period of time, the second period of time beginning after completion of the first period of time;

in the event the second voltage is continuously detected for the second period of time, issuing a second message to indicate successful completion of the second debounce test; and increasing the first period of time in the event the second voltage is not continuously detected for the second period of time, wherein increasing comprises increasing the first period of time by at least one unit, the one unit being equal to a sampling rate of a detector used to monitor the voltage level.

2. The method of claim 1 further comprising decreasing the second period of time by an amount equal to an amount of time in which the first period of time was increased.

3. The method of claim 1 further comprising increasing the first period of time by one unit each time the second voltage is not continuously detected for the second period of time.

4. The method of claim 3 further comprising decreasing the first period of time by two units each time for each occurrence of the second voltage being continuously detected for the second period of time.

5. The method of claim 4 further comprising decreasing of the first period of time not less than an original length the first period of time prior to increasing.

6. The method of claim 1 further comprising transitioning a vehicle system from a sleeping state to a partially operable state, but not a fully operation state, upon receipt of the first message.

7. The method of claim 6 further comprising transitioning the vehicle system from the partially operational state to the fully operational state upon receipt of the second message.

8. The method of claim 7 further comprising transitioning the vehicle system to the fully operational state by powering a plurality of pins used to control one or more operations associated with the vehicle system.

9. The method of claim 8 further comprising transitioning the vehicle system to the partially operational state by powering a portion of the plurality of pins such that at least one pin powered in the fully operation state is not powered in the partially operational state.

10. The method of claim 6 further comprising preventing the vehicle system from operating in the fully operational state until receipt of the second message.

11. The method of claim 1 wherein the second period of time is longer than the first period of time.

12. A debounce controller being operable to:
monitor a voltage level of a detection circuit used to generate electrical signals reflective of a switch being actuated from a first position to a second position, the voltage level changing from a first level to a second level upon actuation of the switch from the first position to the second position;
conduct a primary debounce test to determine whether the second voltage is continuously detected for at least a first period of time;
conduct a secondary debounce test to determine whether the second voltage is continuously detected for a second period of time, the secondary debounce test being conducting only following a successful primary debounce test;
lengthen the first period of time for a next time the primary debounce test is to be conducted following an unsuccessful secondary debounce test; and lengthen the first period of time by one unit, the one unit being equal to a sampling rate of a detection circuit used to monitor the voltage level.

13. The debounce controller of claim 12 further being operable to shorten a previously lengthened first period of time following a successful second debounce test conducted after lengthening the first period of time.

14. The debounce controller of claim 12 further being operable to shorten the first period of time by two units each time the secondary debounce test is successful after the first period of time had been lengthened by more than two units.

15. A passive entry system for use in a vehicle comprising:
at least one fob being operable to transmit at least one signal;
a passive entry controller operable to facilitate executing passive entry related control of one or more vehicle systems when in a fully operational state in response to the at least one signal, the passive entry controller being operable in a partially operational state where the passive entry controller is awaken from a sleeping state but prevented from executing the passive entry related control of the one or more vehicle systems; and
a debounce controller being operable to:
(i) monitor a voltage level of a circuit connected to a switch to detect actuation of the switch from a first position to a second position:
(ii) conduct a first debounce test to determine whether the voltage level is greater than a first threshold for at least a first period of time;
(iii) conduct a second debounce test to determine whether the voltage level is greater than the first threshold for at least a second period of time;
(iv) lengthen the first period of time by one unit for a next time the primary debounce test is to be conducted following an unsuccessful second debounce test, the one unit being equal to a sampling rate of a detection circuit used to monitor the voltage level; and
(v) transmit a first message upon successful completion of the first debounce test and a second message upon successful completion of the second debounce test, the passive entry controller being operable to transition to the partially operational state upon receipt of the first message, and thereafter, to the fully operational state upon receipt of the second message.

16. The system of claim 15 wherein the debounce controller is further operable to incrementally lengthen the first period of time for each time up to a predefined number of times where each time is define by the first debounce test being successful and the following second debounce test being unsuccessful.

17. The system of claim 16 wherein the debounce controller is further operable to incrementally shorten the first period of time for each time up to a predefined number of times where each time is defined by the second debounce test being successful and the first period of time in the previous first debounce test being lengthened.

* * * * *

UNITED STATES PATENT AND TRADEMARK OFFICE
CERTIFICATE OF CORRECTION

PATENT NO.        : 8,570,147 B2                              Page 1 of 1
APPLICATION NO.   : 12/787650
DATED             : October 29, 2013
INVENTOR(S)       : Hilton W. Girard, III et al.

It is certified that error appears in the above-identified patent and that said Letters Patent is hereby corrected as shown below:

In the Claims:

Column 10, Line 20, Claim 15:

After "passive entry" delete "awaken" and
Insert -- awakened --.

Column 10, Line 33, Claim 15:

After "time the" and before "debounce" delete "primary" and
Insert -- first --.

Column 10, Line 48, Claim 16:

After "number of times where each time is" delete "define" and
Insert -- defined --.

Signed and Sealed this
Thirteenth Day of May, 2014

Michelle K. Lee
*Deputy Director of the United States Patent and Trademark Office*